US012639037B2

(12) United States Patent
Kang et al.

(10) Patent No.: US 12,639,037 B2
(45) Date of Patent: *May 26, 2026

(54) SEMICONDUCTOR MEMORY DEVICE EMPLOYING PROCESSING IN MEMORY (PIM) AND METHOD OF OPERATING THE SEMICONDUCTOR MEMORY DEVICE

(71) Applicant: Samsung Electronics Co., Ltd., Suwon-si (KR)

(72) Inventors: Shinhaeng Kang, Suwon-si (KR); Seongil O, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/486,518

(22) Filed: Oct. 13, 2023

(65) Prior Publication Data

US 2024/0036820 A1     Feb. 1, 2024

Related U.S. Application Data

(63) Continuation of application No. 17/547,991, filed on Dec. 10, 2021, now Pat. No. 11,822,898, which is a
(Continued)

(30) Foreign Application Priority Data

Dec. 3, 2018     (KR) ........................ 10-2018-0153725

(51) Int. Cl.
*G06F 7/48* (2006.01)
*G06F 13/16* (2006.01)
(Continued)

(52) U.S. Cl.
CPC ................ *G06F 7/48* (2013.01); *G06F 13/16* (2013.01); *G06F 17/16* (2013.01); *G06G 7/16* (2013.01);
(Continued)

(58) Field of Classification Search
CPC ........ G06F 7/48; G06F 15/7821; G06F 13/16; G06F 13/1678; G06F 17/15–153;
(Continued)

(56) References Cited

U.S. PATENT DOCUMENTS 5,715,433 A     2/1998   Raghavan et al.
5,805,617 A *   9/1998   Im ........................ H03M 13/151
                                                      714/784
(Continued)

FOREIGN PATENT DOCUMENTS

CN     101276641 A     10/2008
CN     101667105 A     3/2010
(Continued)

OTHER PUBLICATIONS

Hennessy, John L., et al. Computer Architecture : A Quantitative Approach, Elsevier Science & Technology, 2014. ProQuest Ebook Central,http://ebookcentral.proquest.com/lib/uspto-ebooks/detail. action?docID=404052. (Year: 2014).*
(Continued)

*Primary Examiner* — Andrew Caldwell
*Assistant Examiner* — Huy Duong
(74) *Attorney, Agent, or Firm* — NSIP Law

(57) ABSTRACT

A semiconductor memory device includes a plurality of memory bank groups configured to be accessed in parallel; an internal memory bus configured to receive external data from outside the plurality of memory bank groups; and a first computation circuit configured to receive internal data from a first memory bank group of the plurality of memory bank groups during each first period of a plurality of first periods, receive the external data through the internal memory bus during each second period of a plurality of second periods, the second period being shorter than the first period, and perform a processing in memory (PIM) arithmetic operation
(Continued)

on the internal data and the external data during each second period.

16 Claims, 12 Drawing Sheets

Related U.S. Application Data continuation of application No. 16/691,033, filed on Nov. 21, 2019, now Pat. No. 11,550,543.

(51) Int. Cl.
| | | |
|---|---|---|
| *G06F 17/16* | (2006.01) | |
| *G06G 7/16* | (2006.01) | |
| *G11C 7/10* | (2006.01) | |

(52) U.S. Cl.
CPC .... *G11C 7/1048* (2013.01); *G11C 2207/2272* (2013.01)

(58) Field of Classification Search
CPC ..... G06F 17/16; G11C 7/1048; G11C 7/1006; G11C 7/22; G11C 2207/22; G11C 2207/2272; G11C 2207/2281; G06N 3/04; G06N 3/063; G06N 3/08; G06N 3/044; G06N 3/045; G06N 3/047; G06N 3/0464; G06N 3/0475; G06N 3/0495; G06N 3/0499; G06N 3/0895; G06N 3/09; G06N 3/091; G06N 3/092; G06N 3/094; G06N 3/096; G06N 3/098; G06G 7/16
See application file for complete search history.

(56) References Cited

U.S. PATENT DOCUMENTS

| | | | | |
|---|---|---|---|---|
| 5,881,056 | A * | 3/1999 | Huang | H04B 1/7115 |
| | | | | 370/335 |
| 6,028,795 | A | 2/2000 | Kimura et al. | |
| 6,112,294 | A * | 8/2000 | Merchant | H04L 49/602 |
| | | | | 713/502 |
| 6,765,928 | B1 * | 7/2004 | Sethuram | H04J 3/1611 |
| | | | | 370/476 |
| 7,633,833 | B2 | 12/2009 | Takemura et al. | |
| 9,490,004 | B2 | 11/2016 | Jeong | |
| 10,008,247 | B2 | 6/2018 | Oh et al. | |
| 10,019,367 | B2 | 7/2018 | O et al. | |
| 10,204,665 | B2 * | 2/2019 | Kim | G06F 13/161 |
| 10,417,555 | B2 | 9/2019 | Brothers et al. | |
| 2003/0033492 | A1 | 2/2003 | Akiyama et al. | |

| | | | | |
|---|---|---|---|---|
| 2010/0312997 | A1 | 12/2010 | Walker | |
| 2011/0164460 | A1 | 7/2011 | Kajigaya et al. | |
| 2012/0117317 | A1 * | 5/2012 | Sheffler | G11C 7/1039 |
| | | | | 711/E12.008 |
| 2013/0283001 | A1 | 10/2013 | Ishikawa | |
| 2013/0283016 | A1 * | 10/2013 | Yamasaki | G05B 19/0426 |
| | | | | 712/221 |
| 2014/0075135 | A1 | 3/2014 | Choi et al. | |
| 2016/0172015 | A1 | 6/2016 | Manning | |
| 2016/0328645 | A1 | 11/2016 | Lin et al. | |
| 2016/0328646 | A1 | 11/2016 | Lin et al. | |
| 2016/0328647 | A1 | 11/2016 | Lin et al. | |
| 2016/0342890 | A1 | 11/2016 | Young | |
| 2016/0342891 | A1 | 11/2016 | Ross et al. | |
| 2016/0358069 | A1 | 12/2016 | Brothers et al. | |
| 2016/0379115 | A1 | 12/2016 | Burger et al. | |
| 2017/0011288 | A1 | 1/2017 | Brothers et al. | |
| 2017/0024337 | A1 | 1/2017 | Walker et al. | |
| 2017/0344301 | A1 | 11/2017 | Ryu et al. | |
| 2018/0232640 | A1 | 8/2018 | Ji et al. | |
| 2019/0096453 | A1 | 3/2019 | Shin et al. | |
| 2020/0026498 | A1 | 1/2020 | Sumbul et al. | |
| 2020/0034148 | A1 * | 1/2020 | Sumbul | G06N 3/063 |
| 2020/0160161 | A1 * | 5/2020 | Yoo | G06N 3/044 |
| 2022/0223185 | A1 * | 7/2022 | Son | G06F 7/5443 |
| 2023/0025068 | A1 * | 1/2023 | Badaroglu | G06F 15/80 |

FOREIGN PATENT DOCUMENTS

| | | |
|---|---|---|
| CN | 102486495 A | 6/2012 |
| CN | 103426468 A | 12/2013 |
| CN | 106066786 A | 11/2016 |
| JP | 2013-182373 A | 9/2013 |
| JP | 2013-229068 A | 11/2013 |
| KR | 10-2013-0124884 A | 11/2013 |
| KR | 10-2016-0140394 A | 12/2016 |
| KR | 10-2016-0142791 A | 12/2016 |
| KR | 10-2016-0144698 A | 12/2016 |
| KR | 10-2017-0070920 A | 6/2017 |
| WO | WO 2011/022114 A1 | 2/2011 |

OTHER PUBLICATIONS

Extended European Search Report issued on Apr. 8, 2020, in counterpart European Patent Application No. 19213125.8 (9 pages in English).

Chinese Office Action issued on Mar. 22, 2024, in counterpart Chinese Patent Application No. 201910840521.0 (14 pages in English, 14 pages in Chinese).

Extended European search report issued on Jul. 3, 2024, in counterpart European Patent Application No. 24171178.7 (10 pages).

* cited by examiner

FIG. 1
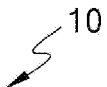
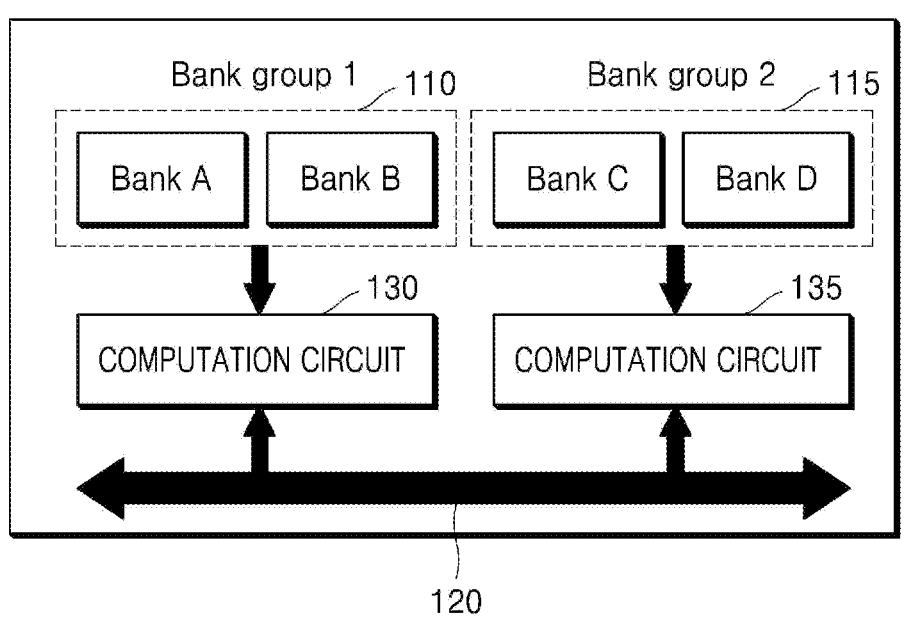

Figure 7:
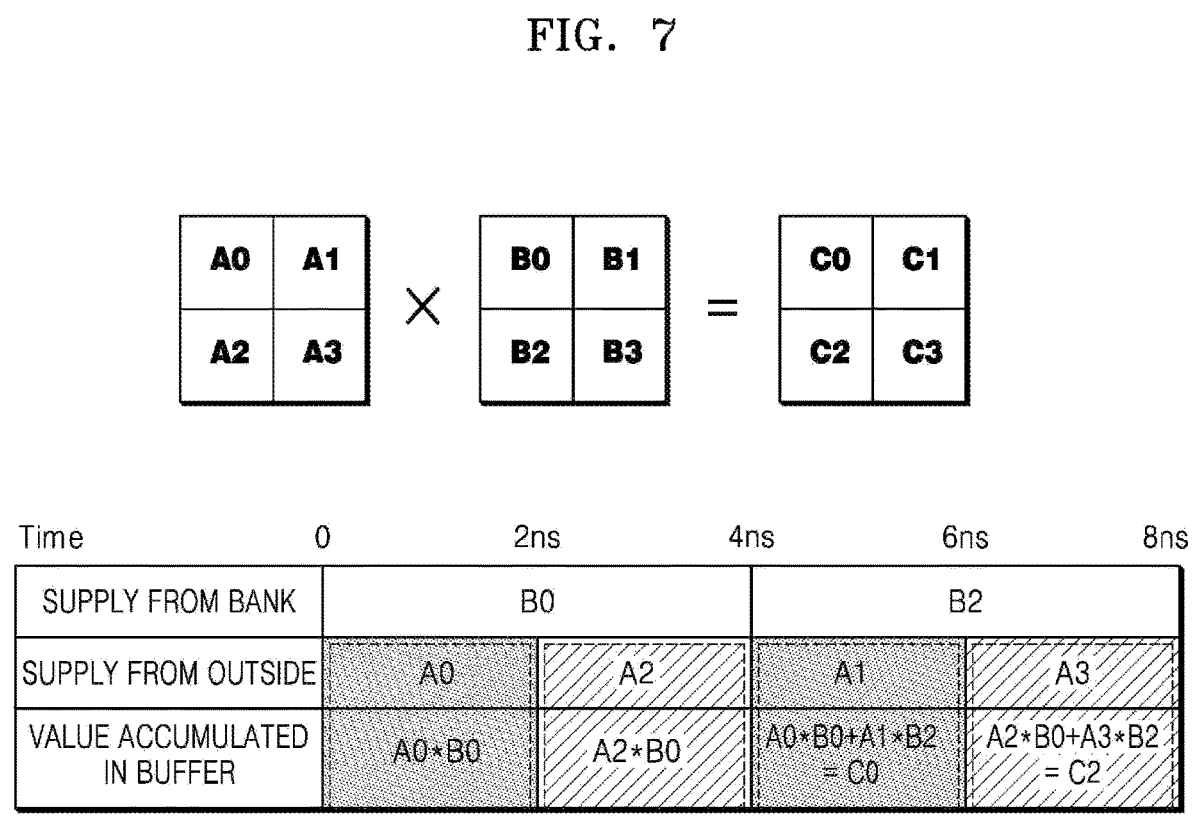

| A0 | A1 |
|----|----|
| A2 | A3 |

$\times$

| B0 | B1 |
|----|----|
| B2 | B3 |

$=$

| C0 | C1 |
|----|----|
| C2 | C3 |

| Time | 0 | 2ns | 4ns | 6ns | 8ns |
|------|---|-----|-----|-----|-----|
| SUPPLY FROM BANK | B0 | | | B2 | |
| SUPPLY FROM OUTSIDE | A0 | A2 | A1 | A3 | |
| VALUE ACCUMULATED IN BUFFER | A0*B0 | A2*B0 | A0*B0+A1*B2 = C0 | A2*B0+A3*B2 = C2 | |

FIG. 9
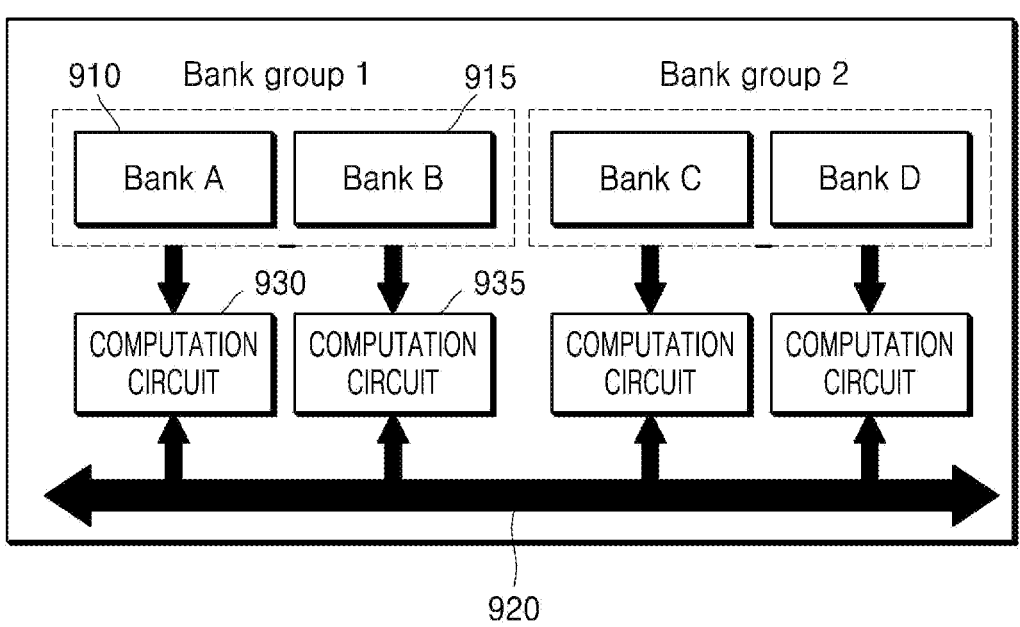

FIG. 10

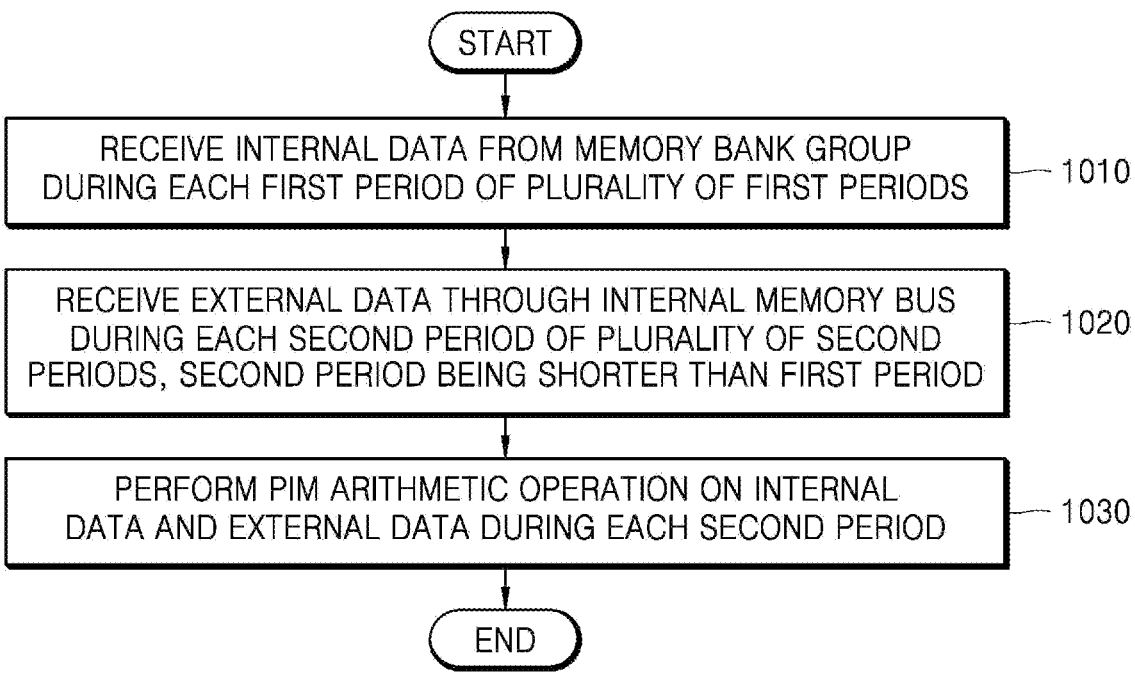

START

RECEIVE INTERNAL DATA FROM MEMORY BANK GROUP
DURING EACH FIRST PERIOD OF PLURALITY OF FIRST PERIODS — 1010

RECEIVE EXTERNAL DATA THROUGH INTERNAL MEMORY BUS
DURING EACH SECOND PERIOD OF PLURALITY OF SECOND
PERIODS, SECOND PERIOD BEING SHORTER THAN FIRST PERIOD — 1020

PERFORM PIM ARITHMETIC OPERATION ON INTERNAL
DATA AND EXTERNAL DATA DURING EACH SECOND PERIOD — 1030

END

SEMICONDUCTOR MEMORY DEVICE EMPLOYING PROCESSING IN MEMORY (PIM) AND METHOD OF OPERATING THE SEMICONDUCTOR MEMORY DEVICE

CROSS-REFERENCE TO RELATED APPLICATIONS

This application is a Continuation Application of U.S. patent application Ser. No. 17/547,991 filed on Dec. 10, 2021, which is a continuation of application Ser. No. 16/691, 033 filed on Nov. 21, 2019, now U.S. Pat. No. 11,550,543, issued on Jan. 10, 2023, and claims the benefit under 35 USC 119(a) of Korean Patent Application No. 10-2018-0153725 filed on Dec. 3, 2018, in the Korean Intellectual Property Office, the entire disclosures of which are incorporated herein by reference in their entirety.

BACKGROUND

1. Field

This application relates to a semiconductor memory device employing processing in memory (PIM), and a method of operating the semiconductor memory device.

2. Description of Related Art

A semiconductor memory device according to the related art has a completely separate function from a processor performing an arithmetic operation. Therefore, in a system that implements applications such as a neural network, big data, and the Internet of Things (IoT) in which a large amount of data must be processed, a large amount of data is transmitted and received between the semiconductor memory device and the processor, and thus bottlenecks may occur frequently. To solve such a problem, research into a processing in memory (PIM) device as a semiconductor memory device that combines the function of a processor for performing an arithmetic operation with a memory function is ongoing.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor memory device includes a plurality of memory bank groups configured to be accessed in parallel; an internal memory bus configured to receive external data from outside the plurality of memory bank groups; and a first computation circuit configured to receive internal data from a first memory bank group of the plurality of memory bank groups during each first period of a plurality of first periods, receive the external data through the internal memory bus during each second period of a plurality of second periods, the second period being shorter than the first period, and perform a processing in memory (PIM) arithmetic operation on the internal data and the external data during each second period.

The first period may correspond to a delay time required to consecutively access a same memory bank group of the plurality of memory bank groups, and the second period may correspond to a delay time required to consecutively access different memory bank groups of the plurality of memory bank groups.

The first period may be n times the second period, where n is a natural number equal to or greater than 2.

The computation circuit may be further configured to reuse the internal data n times in performing the PIM arithmetic operation on the internal data and the external data.

The semiconductor memory device may further include a plurality of memory channels, the plurality of memory channels may include a first memory channel including the first memory bank group, and the external data may be any one or any combination of any two or more of data stored in any of the plurality of memory channels other than the first memory channel, data stored in another semiconductor memory device outside the semiconductor memory device, and data processed by a host processor outside the semiconductor memory device.

The first computation circuit may include n buffers each configured to store a result of the PIM arithmetic operation performed on the internal data and the external data, where n is a quotient obtained by dividing the first period by the second period.

The first computation circuit may be further configured to consecutively store the result of the PIM arithmetic operation performed on the internal data and the external data in the n buffers.

The first computation circuit may further include a demultiplexer connected to the n buffers, and a selector configured to output a control signal to control the demultiplexer to select one of the n buffers to store the result of the PIM arithmetic operation performed on the internal data and the external data.

The selector may include a counter configured to count the second periods, and output a count value of the counter as the control signal.

The semiconductor memory device may further include a second computation circuit connected to a second memory bank group of the plurality of memory bank groups, wherein the first computation circuit and the second computation circuit may be configured to operate in parallel with each other.

In another general aspect, in a semiconductor memory device including a plurality of memory bank groups configured to be accessed in parallel, an internal memory bus configured to receive external data from outside the plurality of memory bank groups, and a computation circuit, a method of operating a computation circuit in a semiconductor memory device includes receiving internal data from a first memory bank group of the plurality of memory bank groups during each first period of a plurality of first periods; receiving the external data through the internal memory bus during each second period of a plurality of second periods, the second period being shorter than the first period; and performing a processing in memory (PIM) arithmetic operation on the internal data and the external data during each second period.

The first period may correspond to a delay time required to consecutively access a same memory bank group of the plurality of memory bank groups, and the second period may correspond to a delay time required to consecutively access different memory bank groups of the plurality of memory bank groups.

The first period may be n times the second period, where n is a natural number equal to or greater than 2.

The performing a PIM arithmetic operation on the internal data and the external data may include reusing the internal data n times in performing the PIM arithmetic operation on the internal data and the external data.

The semiconductor memory device may further include a plurality of memory channels, the plurality of memory channels may include a memory channel including the memory bank group, and the external data may be any one or any combination of any two or more of data stored in any of the plurality of memory channels other than the memory channel including the memory bank group, data stored in another semiconductor memory device outside the semiconductor memory device, and data processed by a host processor outside the semiconductor memory device.

The computation circuit may include n buffers, where n is a quotient obtained by dividing the first period by the second period, and the method may further include consecutively storing a result of the PIM arithmetic operation performed on the internal data and the external data in the n buffers.

The computation circuit may further include a demultiplexer connected to the n buffers, and the consecutively storing a result of the PIM arithmetic operation performed on the internal data and the external data may include outputting a control signal to control the demultiplexer to select one of the n buffers to store the result of the PIM arithmetic operation performed on the internal data and the external data.

In another general aspect, a semiconductor memory device includes a plurality of memory banks configured to be accessed in parallel; an internal memory bus configured to receive external data from outside the plurality of memory banks; and a computation circuit configured to receive internal data from a first memory bank of the plurality of memory banks during each first period of a plurality of first periods, receive the external data through the internal memory bus during each second period of a plurality of second periods, the second period being shorter than the first period, and perform a processing in memory (PIM) arithmetic operation on the internal data and the external data during each second period.

The semiconductor memory device may further include a plurality of memory channels, the plurality of memory channels may include a memory channel including the first memory bank, and the external data may be any one or any combination of any two or more of data stored in any of the plurality of memory channels other than the memory channel including the first memory bank, data stored in another semiconductor memory device outside the semiconductor memory device, and data processed by a host processor outside the semiconductor memory device.

The semiconductor memory device may further include a second computation circuit connected to a second memory bank of the plurality of memory banks, wherein the computation circuit and the second computation circuit may be configured to operate in parallel with each other.

In another general aspect, a semiconductor memory device includes a plurality of memory bank groups configured to be accessed in parallel; an internal memory bus configured to receive external data from outside the plurality of memory bank groups; and a computation circuit configured to receive first internal data from a first memory bank group of the plurality of memory bank groups, receive first external data through the internal memory bus, perform a processing in memory (PIM) arithmetic operation on the first internal data and the first external data, receive second external data through the internal memory bus, and perform the PIM arithmetic operation on the first internal data and the second external data.

A waiting time between a time the computation circuit receives the first external data and a time the computation circuit receives the second external data may be equal to a delay time required to consecutively access different memory bank groups of the plurality of memory bank groups, which is shorter than a delay time required to consecutively access a same memory bank group of the plurality of memory bank groups.

The computation circuit may include a first operand buffer configured to receive internal data from the first memory bank group during each first period of a plurality of first periods, the first period being equal to a delay time required to consecutively access a same memory bank group of the plurality of memory bank groups; a second operand buffer configured to receive external data through the internal memory bus during each second period of a plurality of second periods, the second period being equal to a delay time required to consecutively access different memory bank groups of the plurality of memory bank groups and being shorter than the first period; and an arithmetic logic unit (ALU) configured to receive the internal data from the first operand buffer, receive the external data from the second operand buffer, and perform the PIM arithmetic operation on the internal data and the external data.

The first operand buffer may include an input connected to the first memory bank group and configured to receive the internal data, and an output configured to output the internal data, the second operand buffer may include an input connected to the internal memory bus and configured to receive the external data, and an output configured to output the external data, the ALU may include a first input connected to the output of the first operand buffer and configured to receive the internal data, a second input connected to the output of the second operand buffer and configured to receive the external data, and an output configured to output a result of the PIM operation performed on the internal data and the external data, and the computation circuit may further include a demultiplexer including a first input connected to the output of the ALU and configured to receive the result of the PIM operation performed on the internal data and the external data, a second input configured to receive a control signal, a first output, and a second output, the demultiplexer being configured to alternately connect the first input of the demultiplexer to the first output of the demultiplexer and the second output of the demultiplexer in response to the control signal; a first buffer including an input connected to the first output of the demultiplexer; a second buffer including an input connected to the second output of the demultiplexer; and a selector including an output connected to the second input of the demultiplexer, the selector being configured to count the second periods, generate the control signal based on a count value of the second periods, and output the control signal through the output of the selector.

The computation circuit may be further configured to receive second internal data from the first memory bank group, receive third external data through the internal memory bus, perform the PIM arithmetic operation on the second internal data and the third external data, receive fourth external data through the internal memory bus, and perform the PIM arithmetic operation on the second internal data and the fourth external data.

A waiting time between a time the computation circuit receives the first internal data and a time the computation circuit receives the second internal data may be equal to a first delay time required to consecutively access a same memory bank group of the plurality of memory bank groups, and a waiting time between a time the computation circuit receives the first external data and a time the computation circuit receives the second external data, a waiting time between the time the computation circuit receives the second external data and a time the computation circuit receives the third external data, and a waiting time between the time the computation circuit receives the third external data and a time the computation circuit receives the fourth external data, may be equal to a second delay time required to consecutively access different memory bank groups of the plurality of memory bank groups, which is shorter than the first delay time.

The semiconductor memory device may further include a first buffer; and a second buffer, wherein the computation circuit may be further configured to store a result of the PIM arithmetic operation performed on the first internal data and the first external data in the first buffer, store a result of the PIM arithmetic operation performed on the first internal data and the second external data in the second buffer, add a result of the PIM arithmetic operation performed on the second internal data and the third external data to the result of the PIM arithmetic operation performed on the first internal data and the first external data stored in the first buffer to obtain a first sum result, store the first sum result in the first buffer, add a result of the PIM arithmetic operation performed on the second internal data and the fourth external data to the result of the PIM arithmetic operation performed on the first internal data and the second external data stored in the second buffer to obtain a second sum result, and store the second sum result in the second buffer.

Other features and aspects will be apparent from the following detailed description, the drawings, and the claims.

BRIEF DESCRIPTION OF THE DRAWINGS

FIG. 1 is a block diagram of an example of a semiconductor memory device.

FIGS. 3 and 4 are diagrams for comparing a method of operating a semiconductor memory device according to the disclosure of this application with a method of operating a semiconductor memory device according to the related art.

FIG. 7 is a diagram for explaining an example of a process in which a semiconductor memory device performs a matrix multiplication operation.

FIG. 9 is a block diagram of another example of a semiconductor memory device.

FIG. 10 is a flowchart of an example a method of operating a computation circuit included in a semiconductor memory device.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 2:
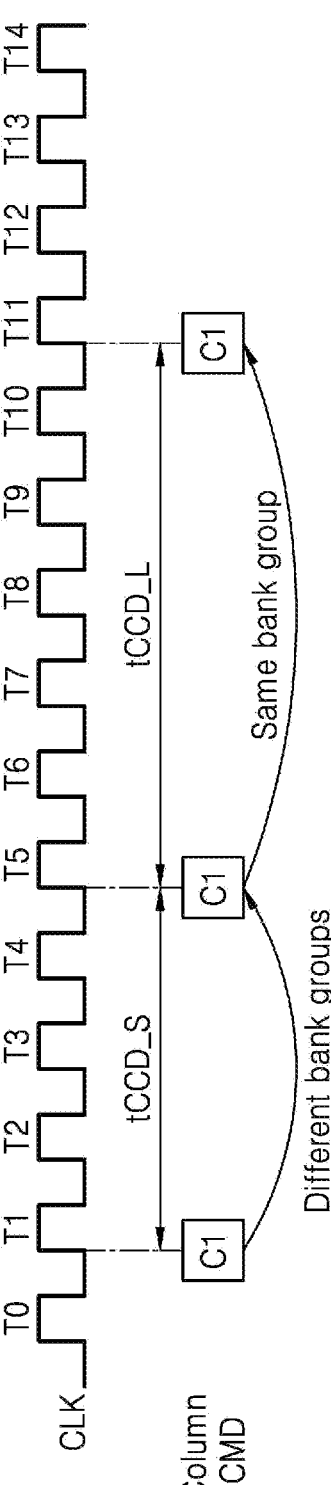
FIG. 2 is a diagram for explaining an example of a first period and a second period.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which the disclosure of this application pertains based on an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a block diagram of an example of a semiconductor memory device.

Referring to FIG. 1, a semiconductor memory device 10 includes a first memory bank group 110, a second memory bank group 115, an internal memory bus 120, a first computation circuit 130, and a second computation circuit 135. Only the components that are relevant to this example are shown in the semiconductor memory device 10 of FIG. 1. Therefore, the semiconductor memory device 10 may further include general components other than the components shown in FIG. 1. For example, the semiconductor memory device 10 may further include a memory controller (not shown). The memory controller may perform overall operations for controlling the semiconductor memory device 10. The memory controller may be implemented by an array of logic gates, or may be implemented by a combination of a microprocessor and a memory storing a program to be executed by the microprocessor to perform the operations of the memory controller.

In FIG. 1, only one memory channel included in the semiconductor memory device 10 is shown. However, the semiconductor memory device 10 may further include additional memory channels. Although only two memory bank groups and two computation circuits are shown in FIG. 1 for convenience of description, the semiconductor memory device 10 may include a larger number of memory bank groups and computation circuits.

Each of the first memory bank group 110 and the second memory bank group 115 is a memory area that can be accessed in parallel. The first memory bank group 110 and the second memory bank group 115 share the internal memory bus 120 through the first computation circuit 130 and the second computation circuit 135, and thus in a normal memory read or write operation, only one of the first memory bank group 110 and the second memory bank group 115 is able to use the internal memory bus 120. Since each of the first memory bank group 110 and the second memory bank group 115 can be independently accessed, separate read operations may be performed on the first memory bank group 110 and the second memory bank group 115 at the same time. For example, when data is read from the first memory bank group 110, data may also be read from the second memory bank group 115 as well. In this case, the semiconductor memory device 10 may be described as having bank group unit parallelism. Each of the first memory bank group 110 and the second memory bank group 115 include a plurality of memory banks. Each of the plurality of memory banks is a minimum unit of a memory area that can be accessed in parallel.

The internal memory bus 120 is a data transmission path formed between the components included in the semiconductor memory device 10 so that data may be transmitted and received between the components. For example, the internal memory bus 120 is shared between the first memory bank group 110 and the second memory bank group 115 through the first computation circuit 130 and the second computation circuit 135. In addition, the internal memory bus 120 forms a connection path between the components included in the semiconductor memory device 10 and components outside the semiconductor memory device 10. For example, the internal memory bus 120 receives external data from outside a plurality of memory bank groups included in the semiconductor memory device 10. The internal memory bus 120 supplies the external data to either one or both of the first computation circuit 130 and the second computation circuit 135. The meaning of "outside the plurality of memory bank groups" will be described in more detail below with reference to FIG. 5.

The first computation circuit 130 will now be described in detail. The description of the first computation circuit 130 is also applicable to the second computation circuit 135.

The first computation circuit 130 is hardware that performs an arithmetic operation within the semiconductor memory device 10. For example, the first computation circuit 130 may include an arithmetic logic unit (ALU), and the arithmetic operation may be an operation such as addition, subtraction, integration, and accumulation, but is not limited thereto. The first computation circuit 130 may be implemented by an array of logic gates, or may be implemented by a combination of an array of logic gates and a buffer for temporarily storing data. Since the semiconductor memory device 10 includes the first computation circuit 130 for performing an arithmetic operation in the semiconductor memory device 10, the semiconductor memory device 10 a processing in memory (PIM) architecture.

The first computation circuit 130 is hardware having a processing function, similar to a host processor such as a Central Processing Unit (CPU), a Graphics Processing Unit (GPU), or a Digital Signal Processor (DSP) outside the semiconductor memory device 10, and may be a processor packaged together with a plurality of memory bank groups in a chip of a memory package of the semiconductor memory device 10. The first computation circuit 130 may be referred to as an internal processor because the first computation circuit 130 is inside the semiconductor memory device 10, and the host processor may be referred to as an external processor because the host processor is outside the semiconductor memory device 10. In a PIM architecture, an internal processor and a memory are implemented on a single chip, enabling fast memory access with low latency. In addition, when the PIM architecture uses parallelism in bank units or bank group units, the PIM architecture may have several times to several tens of times a memory bandwidth of an architecture that does not use parallelism in bank units or bank group units. The semiconductor memory device 10 having the PIM architecture may also be referred to as intelligent Random-Access Memory (RAM), a computational RAM, or a smart memory.

The first computation circuit 130 connected to the first memory bank group 110 operates in parallel with the second computation circuit 135 connected to the second memory bank group 115. The first computation circuit 130 and the second computation circuit 135 perform arithmetic operations independently from each other. For example, while the first computation circuit 130 performs an arithmetic operation using data received from the first memory bank group 110, the second computation circuit 135 performs an arithmetic operation using data received from the second memory bank group 115.

The first computation circuit 130 receives internal data from the first memory bank group 110 during each first period of a plurality of first periods. The internal data is data stored in the first memory bank group 110 and corresponds data stored to at least some of a plurality of memory addresses assigned to the first memory bank group 110. Also, the first computation circuit 130 receives external data through the internal memory bus 120 during each second period of a plurality of second periods, the second period being shorter than the first period. The external data is data stored outside the plurality of memory bank groups or processed outside the plurality of memory bank groups, and the meaning of the external data will be described in more detail below with reference to FIG. 5. The first computation circuit 130 performs an arithmetic operation on the internal data and the external data during each second period. Hereinafter, the first period and the second period will be described in detail with reference to FIG. 2, and an effect obtained by the operation of the first computation circuit 130 described above will be described in more detail with reference to FIGS. 3 and 4.

FIG. 2 is a diagram for explaining an example of a first period and a second period.

FIG. 2 shows a timing diagram illustrating a timing at which a read operation for a memory bank group is performed according to a clock signal CLK. When a command Column CMD to perform a read operation on a memory bank group is transmitted to the memory bank group, a delay time tCCD_L required to consecutively access the same memory bank group is greater than a delay time tCCD_S required to consecutively access different memory bank groups. The first period described with reference to FIG. 1 corresponds to the delay time tCCD_L required to consecutively access the same memory bank group, and the second period described with reference to FIG. 1 corresponds to the delay time tCCD_S required to consecutively access different memory bank groups. tCCD denotes a column-to-column delay, L denotes "Long," and S denotes "Short."

A PIM architecture may be implemented with Double Data Rate (DDR) DRAM or DDR SDRAM. A PIM architecture based on the latest DDR DRAM or DDR SDRAM generally uses parallelism in bank units or parallelism in bank group units. For example, a DDR4-based PIM architecture uses parallelism in bank group units and has a problem that the delay time is always tCCD_L because the PIM architecture always needs to consecutively access the same memory bank group. Since data is simultaneously read from a plurality of memory bank groups, the amount of data to be read at one time increases, but the rate at which the data is read is always limited to tCCD_L. As a result, the overall arithmetic operation speed of the DDR4-based PIM architecture is limited.

According to the disclosure of this application, the overall arithmetic operation speed of a DDR4-based PIM architecture is increased by supplying external data to the first computation circuit 130 at a period of tCCD_S during a waiting period of tCCD_L after data is read from a memory bank group until data can be read again from the same memory bank group. The waiting period of tCCD_L is greater than the delay time tCCD_S required to consecutively access different memory bank groups.

Figure 3:
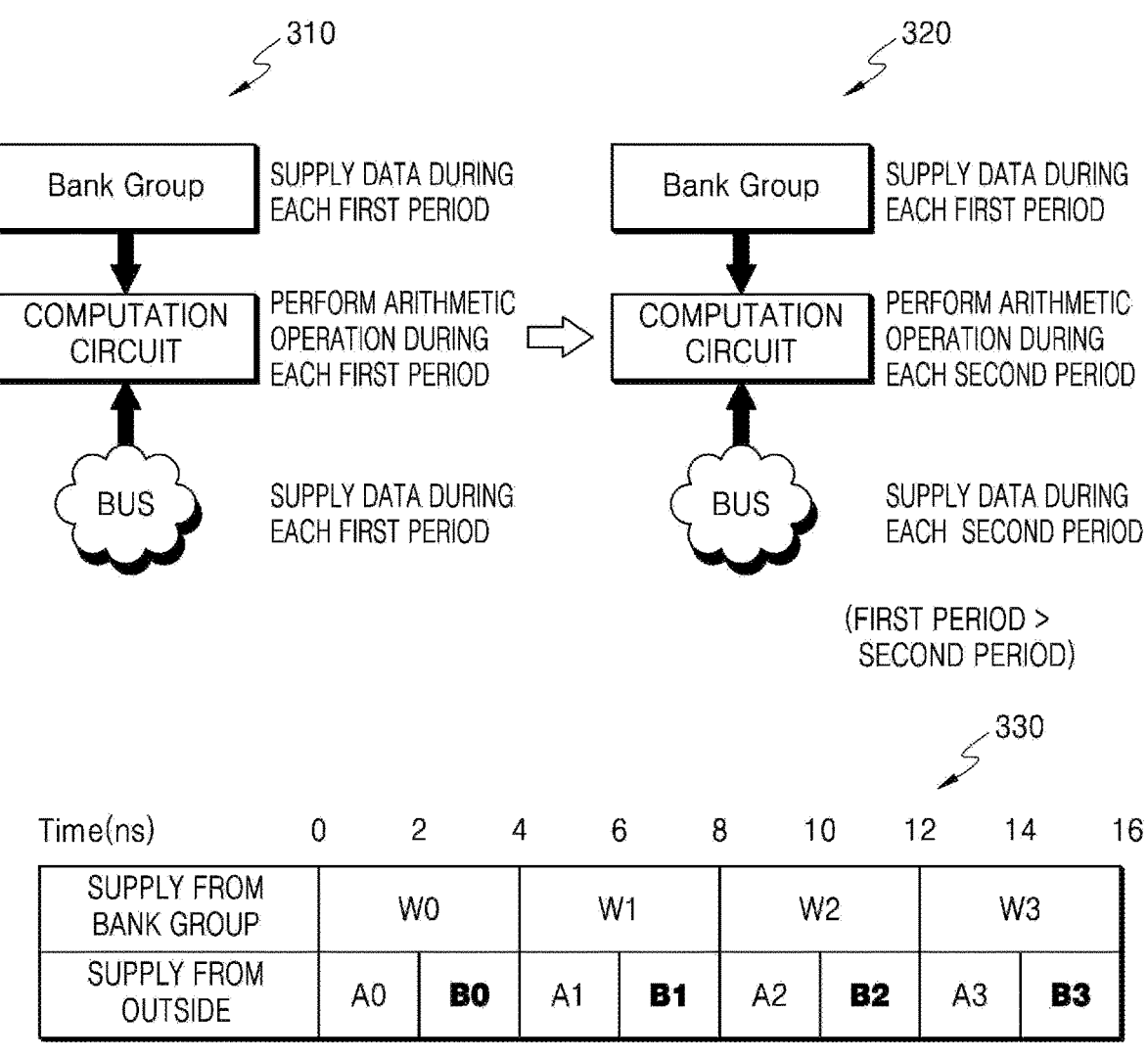
Figure 4:
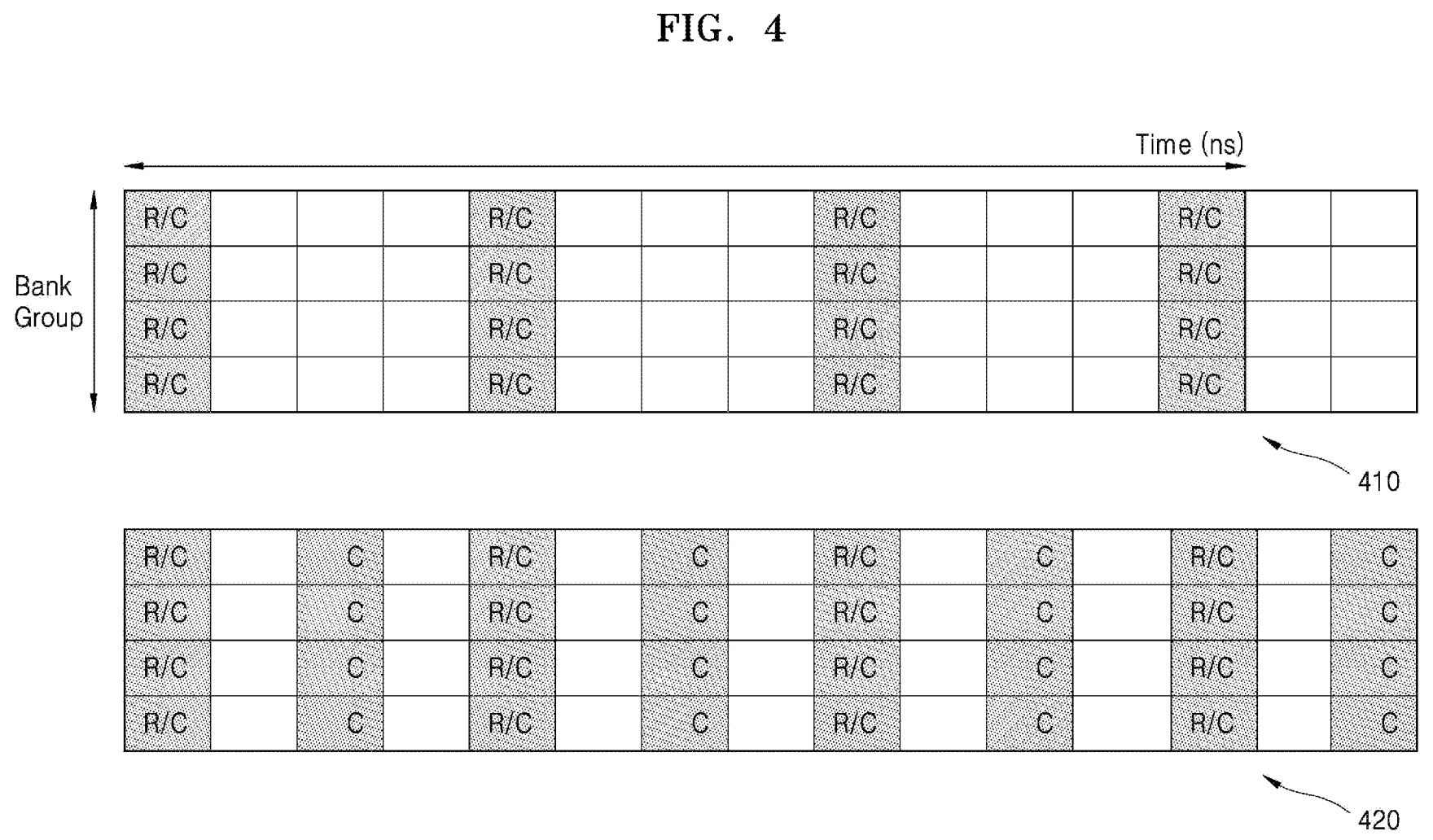

FIGS. 3 and 4 are diagrams for comparing a method of operating a semiconductor memory device according the disclosure of this application with a method of operating a semiconductor memory device according to the related art.

FIG. 3 shows a conceptual diagram 310 illustrating a method of operating a semiconductor memory device according to the related art, and a conceptual diagram 320 illustrating a method of operating a semiconductor memory device according to the disclosure of this application. In FIG. 3, "Bank Group" denotes a memory bank group, and "Bus" denotes an internal memory bus.

Referring to the conceptual diagram 310 illustrating a method of operating a semiconductor memory device according to the related art, internal data is read from a memory bank group during each first period, so the internal data is supplied to a computation circuit during each first period. Furthermore, external data is supplied to the computation circuit through the internal memory bus during each first period. Since the computation circuit performs an arithmetic operation using the internal data and the external data, the arithmetic operation is performed during each first period. Accordingly, in the method of operating a semiconductor memory device according to the related art, an arithmetic operation speed of the computation circuit is limited to the first period.

Referring to the conceptual diagram 320 illustrating a method of operating a semiconductor device according to the disclosure of this application, internal data is read from a memory bank group during each first period like it is in the conceptual diagram 310, so the internal data is supplied to a computation circuit during each first period. However, unlike the conceptual diagram 310, in the semiconductor memory device according to the disclosure of this application, external data is supplied to the computation circuit through the internal memory bus during each second period, so the computation circuit performs an arithmetic operation on the internal and external data during each second period. Since the second period is shorter than the first period, in the method of operating a semiconductor memory device according to the disclosure of this application, the arithmetic operation speed of the computation circuit is increased.

In the example illustrated in FIG. 3, the first period is n times the second period, where n is a natural number equal to or greater than 2. However, n does not necessarily have to be a natural number equal to or greater than 2. That is, n may have any value as long as n is equal to or greater than 2. For example, n may be any real number equal to or greater than 2. A table 330 in FIG. 3 shows data supplied from a memory bank group and data supplied from outside the memory bank group according to time when the first period and the second period in the semiconductor memory device according to the disclosure of this application are 4 ns and 2 ns, respectively, and n is 2. Hereinafter, the meanings of "outside the memory bank group" and "external data" will be described in more detail with reference to FIG. 5.

Figure 5:
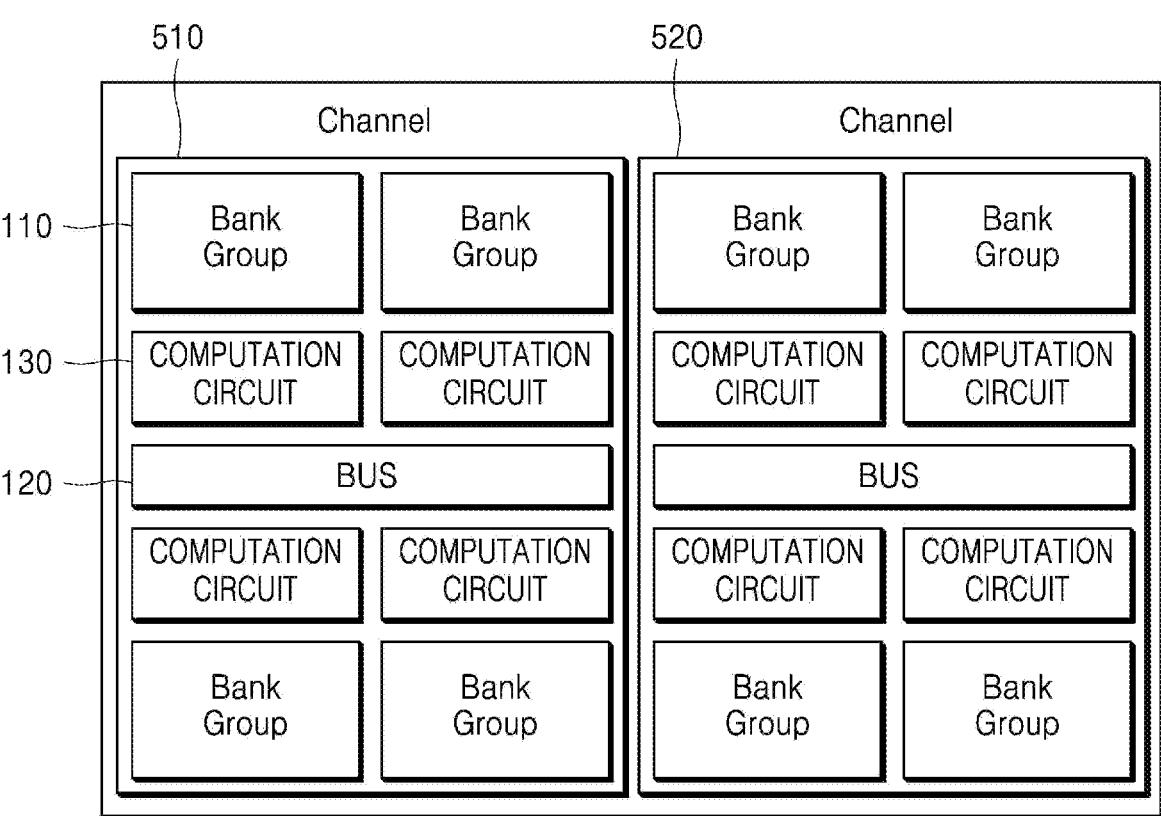
FIG. 5 is a diagram of an example of a configuration of a semiconductor memory device for explaining an example of external data.

FIG. 5 is a diagram of an example of a configuration of a semiconductor memory device for explaining an example of external data.

Referring to FIG. 5, an example of a configuration of a semiconductor memory device is shown. The semiconductor memory device includes a plurality of memory channels. In this example, the semiconductor memory device includes a second memory channel 520 in addition to a first memory channel 510 including a first memory bank group 110, an internal memory bus 120, and a first computation circuit 130. The memory channel 520 has the same structure as the memory channel 510. Although only two memory channels are shown in FIG. 5, the semiconductor memory device may include additional memory channels.

With respect to the first memory bank group 110, external data is data stored in the second memory channel 520 other than the first memory channel 510 including the first memory bank group 110. In this example, "outside the first memory bank group 110" refers to the second memory bank group 110" refers to the second memory channel 520. However, this is merely an example, and "outside the first memory bank group 110" may refer to any source of data as long as the source of data is outside the first memory channel 510. For example, the external data may be data stored in another semiconductor memory device outside the semiconductor memory device illustrated in FIG. 5, or data processed by a host processor outside the semiconductor memory device illustrated in FIG. 5. The host processor may include, but is not limited to, a CPU, a GPU, or a DSP.

Referring back to the table 330 in FIG. 3, the first computation circuit 130 receives internal data W0 from the first memory bank group 110 at 0 ns and receives external data A0 from outside the first memory bank group 110 through the internal memory bus 120 at 0 ns. The first computation circuit 130 performs an arithmetic operation on the internal data W0 and the external data A0.

The first computation circuit 130 receives new external data B0 through the internal memory bus 120 from outside the first memory bank group 110 at 2 ns, at which time new internal data cannot be supplied from the first memory bank group 110. Accordingly, the first computation circuit 130 performs an arithmetic operation on the existing internal data W0 and the new external data B0 at 2 ns. In this manner, even when new internal data cannot be supplied from the first memory bank group 110, the first computation circuit 130 is able to perform an additional arithmetic operation on existing internal data and new external data supplied from outside the first memory bank group 110. The internal data is reused n times in performing arithmetic operations on the internal data and the external data, so the overall arithmetic operation speed of the semiconductor memory device increases by about n times.

FIG. 4 shows a timing diagram 410 illustrating a method of operating a semiconductor memory device according to the related art, and a timing diagram 420 illustrating a method of operating a semiconductor memory device according to the disclosure of this application.

Each of the rows in the timing diagram 410 and the timing diagram 420 represents an operation of a memory bank group according to time, R (Read) denotes that internal data is read from the memory bank group, and C (Compute) denotes that an arithmetic operation is performed by a computation circuit.

Referring to the timing diagram 410 illustrating a method of operating a semiconductor memory device according to the related art, after an arithmetic operation by a computation circuit is performed when internal data is simultaneously read from all of the memory bank groups at 0 ns, a new arithmetic operation by the computation circuit can be performed only when new internal data is read from all of the memory bank groups at 4 ns. Accordingly, in the method of operating a semiconductor memory device according to the related art, arithmetic operations of the computation circuit are dependent on a speed at which the internal data is read from the memory bank groups, and thus the arithmetic operation speed of the computation circuit is limited to 4 ns.

Referring to the timing diagram 420 illustrating a method of operating a semiconductor memory device according to the disclosure of this application, after an arithmetic operation by a computation circuit is performed when internal data is simultaneously read from all of the memory bank groups at 0 ns, a new arithmetic operation by the computation circuit is performed when new external data is supplied from outside the memory bank groups to the computation circuit at 2 ns. Accordingly, in the method of operating a semiconductor memory device according to the disclosure of this application, the arithmetic operation speed of the computation circuit increases to a period of 2 ns. As the arithmetic operation speed of the computation circuit increases, the overall arithmetic operation speed of the semiconductor memory device increases. The computation circuit will be described in more detail below with reference to FIG. 6.

Figure 6:
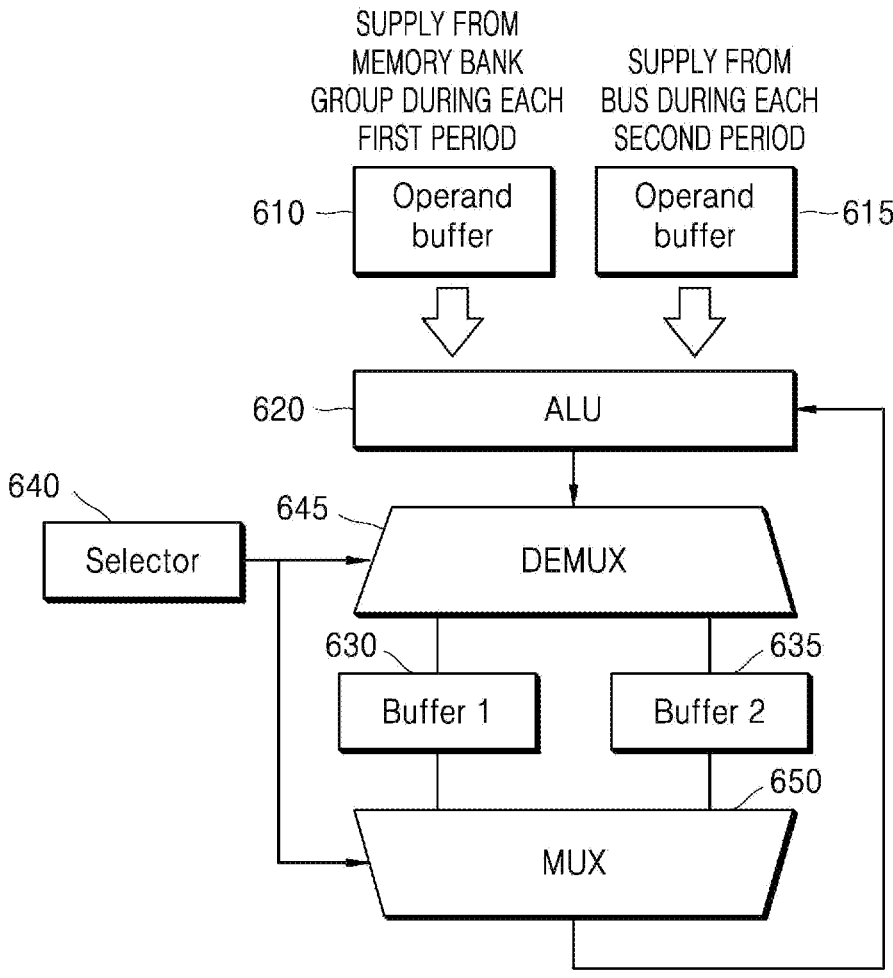
FIG. 6 is a block diagram of an example of a computation circuit.

FIG. 6 is a block diagram of an example of a computation circuit.

Referring to FIG. 6, the computation circuit a first operand buffer 610 for storing internal data supplied from a memory bank group during each first period, and a second operand buffer 615 for storing external data supplied from an internal memory bus during each second period. The computation circuit further includes an ALU 620 for performing an arithmetic operations on the internal data stored in the first operand buffer 610 and the external data stored in the second operand buffer 615. The ALU 620 may be, but is not limited to, a multiplier, an adder, or an integrator. The ALU 620 may be implemented in any suitable manner depending on the type of arithmetic operation to be performed in a PIM architecture.

The computation circuit includes a plurality of buffers for storing the result of an arithmetic operation performed on the internal data and the external data. The number of buffers is equal to a quotient obtained by dividing the first period by the second period. For example, when the first period is n times the second period, the computation circuit includes n buffers. Since it is assumed that n is 2 in the example described with reference to FIGS. 3 and 4, FIG. 6 shows that the computation circuit includes two buffers, a first buffer 630 and a second buffer 635. The number of buffers included in the computation circuit will vary as the relationship between the first period and the second period varies.

The first buffer 630 and the second buffer 635 included in the computation circuit alternately store the result of the arithmetic operation performed by the ALU 620 on the internal data and the external data. For example, referring to the table 330 in FIG. 3, the first buffer 630 stores the result of an arithmetic operation performed on internal data W0 and external data A0 at 0 ns, and the second buffer 635 stores the result of an arithmetic operation performed on the internal data W0 and external data B0 at 2 ns. Then, the first buffer 630 stores the result of an arithmetic operation performed on internal data W1 and external data A1 at 4 ns, and the second buffer 635 stores the result of an arithmetic operation performed on the internal data W1 and external data B1 at 6 ns.

The computation circuit further includes a selector 640, a demultiplexer (DEMUX) 645, and a multiplexer (MUX) 650 to select one of the n buffers for storing the result of the arithmetic operation. The selector 640 outputs a control signal for controlling the demultiplexer 645 to select the first buffer 630 or the second buffer 635 for storing the result of the arithmetic operation performed on the internal data stored in the first operand buffer 610 and the external data stored in the second operand buffer 615, and for controlling the multiplexer 650 to select the first buffer 630 or the second buffer 635 and feed back the result of the arithmetic operation stored in the first buffer 630 or the second buffer 635 to the ALU 620 to be added to the result of the arithmetic operation performed on the internal data stored in the first operand buffer 610 and the external data stored in the second operand buffer 615 in an accumulation operation as described below with respect to FIG. 7.

The demultiplexer 645 is a combinational circuit that outputs data received through one input to one of a plurality of output lines. The multiplexer 650 is a combinational circuit that selects one of a plurality of input lines and connects the selected input line to a single output line. The demultiplexer 645 and the multiplexer 650 determine which one of the first buffer 630 and the second buffer 635 is to be connected to the ALU 620 based on the control signal output by the selector 640.

The selector 640 includes a counter that counts each second period, and the control signal output by the selector 640 is an output signal of the counter. For example, the selector 640 includes a counter having a count value that changes after each second period. The count value that changes after each second period is output from the counter to control inputs of the demultiplexer 645 and the multiplexer 650, and thus the buffer to be connected to the ALU 620 is changed between the first buffer 630 and the second buffer 635 after each second period.

FIG. 7 is a diagram for explaining an example of a process in which a semiconductor memory device performs a matrix multiplication operation.

Referring to FIG. 7, an example of a process in which a semiconductor memory device performs a matrix multiplication operation between a matrix $$\begin{pmatrix} A0 & A1 \\ A2 & A3 \end{pmatrix}$$

and a matrix $$\begin{pmatrix} B0 & B1 \\ B2 & B3 \end{pmatrix}$$

to obtain a matrix $$\begin{pmatrix} C0 & C1 \\ C2 & C3 \end{pmatrix}$$

is shown. The example of FIG. 7 corresponds to a case in which the first period is 4 ns, the second period is 2 ns, and n is 2.

At 0 ns, internal data B0, which is a (1,1) component of the matrix $$\begin{pmatrix} B0 & B1 \\ B2 & B3 \end{pmatrix},$$

is supplied from a memory bank group to a computation circuit, and external data A0, which is a (1,1) component of the matrix $$\begin{pmatrix} A0 & A1 \\ A2 & A3 \end{pmatrix},$$

is supplied from outside the memory bank group to the computation circuit. The computation circuit is configured as a multiplier to perform a matrix multiplication operation, and performs a multiplication operation on A0 and B0. A0*B0, which is the result of the multiplication operation, is stored in a first buffer.

At 2 ns, new external data A2, which is a (2,1) component of the matrix $$\begin{pmatrix} A0 & A1 \\ A2 & A3 \end{pmatrix},$$

is supplied from outside the memory bank group to the computation circuit, and the computation circuit performs a multiplication operation on the new external data A2 and the existing internal data B0. A2*B0, which is the result of the multiplication operation, is stored in a second buffer.

At 4 ns, new internal data B2, which is a (2,1) component of the matrix $$\begin{pmatrix} B0 & B1 \\ B2 & B3 \end{pmatrix},$$

is supplied from the memory bank group to the computation circuit, and new external data A1, which is a (1,2) component of the matrix $$\begin{pmatrix} A0 & A1 \\ A2 & A3 \end{pmatrix},$$

is supplied from outside the memory bank group to the computation circuit. The computation circuit performs a multiplication operation on the new external data A1 and the new internal data B2. A1*B2, which is the result of the multiplication operation, is accumulated with the previous result A0*B0 and stored in the first buffer. An accumulator may be added to either one or both of the front end and the rear end of each of the buffers in the computation circuit to accumulate the result of the multiplication operation. Any type of hardware capable of performing an accumulation operation may be used as the accumulator. For example, in the example of a computation circuit illustrated in FIG. 6, the ALU 620, the selector 640, the demultiplexer 645, the multiplexer 650, and the feedback line from the multiplexer 650 to the ALU 620 enable an accumulation operation to be performed. After A1*B2 is accumulated with the previous result A0*B0 and stored in the first buffer, the first buffer stores a value A0*B0+A1*B2. The value A0*B0+A1*B2 is C0, which is a (1,1) component of the matrix $$\begin{pmatrix} C0 & C1 \\ C2 & C3 \end{pmatrix}$$

obtained by performing the matrix multiplication operation between the matrix $$\begin{pmatrix} A0 & A1 \\ A2 & A3 \end{pmatrix}$$

and the matrix $$\begin{pmatrix} B0 & B1 \\ B2 & B3 \end{pmatrix}.$$

At 6 ns, new external data A3, which is a (2,2) component of the matrix $$\begin{pmatrix} A0 & A1 \\ A2 & A3 \end{pmatrix},$$

is supplied from outside the memory bank group to the computation circuit, and the computation circuit performs a multiplication operation on the new external data A3 and the existing internal data B2. A3*B2, which is the result of the multiplication operation, is accumulated with the previous result A2*B0 and stored in the second buffer. After A3*B2 is accumulated with the previous result A2*B0 and stored in the second buffer, the second buffer stores a value A2*B0+A3*B2. The value A2*B0+A3*B2 is C2, which is a (2,1) component of the matrix $$\begin{pmatrix} C0 & C1 \\ C2 & C3 \end{pmatrix}$$

obtained by performing the matrix multiplication operation between the matrix $$\begin{pmatrix} A0 & A1 \\ A2 & A3 \end{pmatrix}$$

and the matrix $$\begin{pmatrix} B0 & B1 \\ B2 & B3 \end{pmatrix}.$$

The semiconductor memory device completes the matrix multiplication operation between the matrix $$\begin{pmatrix} A0 & A1 \\ A2 & A3 \end{pmatrix}$$

and the matrix $$\begin{pmatrix} B0 & B1 \\ B2 & B3 \end{pmatrix}$$

to obtain C1 and C3, which are respectively a (1,2) component and a (2,2) component of the matrix $$\begin{pmatrix} C0 & C1 \\ C2 & C3 \end{pmatrix},$$

by repeating the above-described process using new internal data B1 and B3 in place of the internal data B0 and B2.

Since external data is supplied from outside the memory bank group during the second period that is shorter than the first period during which the internal data is read from the memory bank group, the semiconductor memory device according to the disclosure of this application performs the matrix multiplication operation between the matrix $$\begin{pmatrix} A0 & A1 \\ A2 & A3 \end{pmatrix}$$

and the matrix $$\begin{pmatrix} B0 & B1 \\ B2 & B3 \end{pmatrix}$$

much faster than a semiconductor memory device according to the related art.

The arithmetic operation performed by the semiconductor memory device is not limited to matrix multiplication. Rather, the semiconductor memory device may perform various other arithmetic operations, and components included in the semiconductor memory device may be controlled in various ways by various PIM arithmetic operation instructions.

Figure 8:
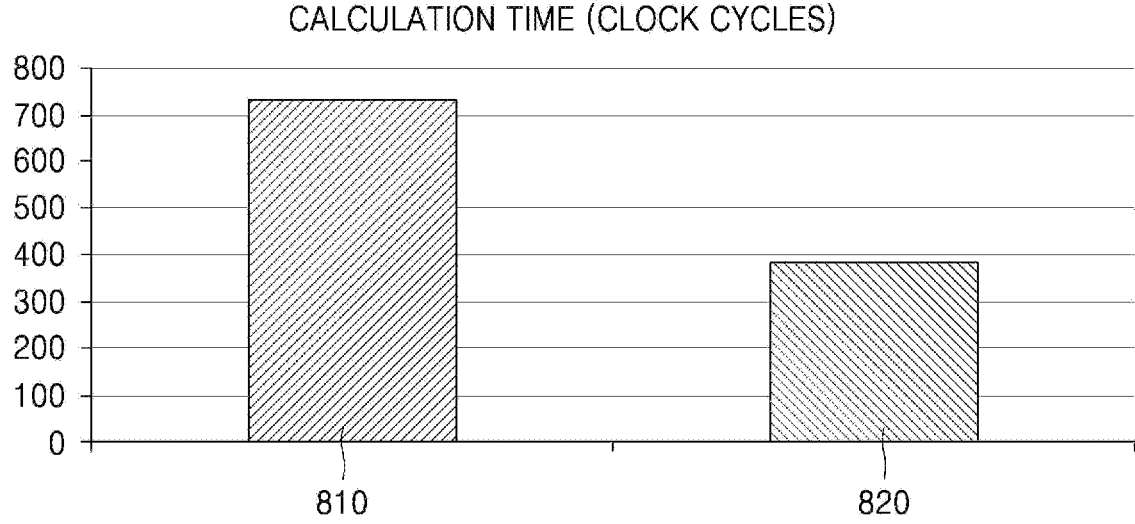
FIG. 8 is a diagram showing simulation results comparing the performance of a method of operating a semiconductor memory device according to the disclosure of this application with the performance of a method of operating a semiconductor memory device according to the related art.

FIG. 8 is a diagram showing simulation results for comparing the performance of a method of operating a semiconductor memory device according to the disclosure of this application with the performance of a method of operating a semiconductor memory device according to the related art.

Referring to FIG. 8, calculation times in clock cycles required for performing a multiplication operation of 32-bit floating-point data 204,800 times in a semiconductor memory device according to the disclosure of this application and a semiconductor memory device according to the related art are shown. The calculation times were obtained using a memory simulator Ramulator that is known in the art.

Referring to a graph 810 in FIG. 8, the calculation time required for the semiconductor memory device according to the related art to perform the multiplication operation of 32-bit floating point data 204,800 times is about 730 clock cycles. Referring to a graph 820 in FIG. 8, the calculation time required for the semiconductor memory device according to the disclosure of this application to perform the multiplication operation of 32-bit floating point data 204, 800 times is about 390 clock cycles.

Accordingly, in the method of operating a semiconductor memory device according to the disclosure of this application, many fewer clock cycles are required to perform the same number of multiplication operations than in the method of operating a semiconductor memory device according to the related art, and thus the arithmetic operation speed of the semiconductor memory device according to the disclosure of this application is faster than the arithmetic operation speed of the semiconductor memory device according to the related art.

FIG. 9 is a block diagram of another example of a semiconductor memory device.

Referring to FIG. 9, a semiconductor memory device 90 uses parallelism in bank units, unlike the semiconductor memory device 10 of FIG. 1, which uses parallelism in bank group units. The semiconductor memory device 90 has the same basic structure as the semiconductor memory device 10, except that a computation circuit is assigned to each memory bank in a memory bank group in the semiconductor memory device 90, instead of being assigned to each memory bank group as it is in the semiconductor memory device 10.

The semiconductor memory device 90 includes a first memory bank 910, a second memory bank 915, an internal memory bus 920, a first computation circuit 930, and a second computation circuit 935. The first memory bank 910 is connected to the first computation circuit 930, and the second memory bank 915 is connected to the second computation circuit 935. The first computation circuit 930 and the second computation circuit 935 perform arithmetic operations independently of each other. For example, while the first computation circuit 930 performs an arithmetic operation using data received from the first memory bank 910, the second computation circuit 935 performs an arithmetic operation using data received from the second memory bank 915. The first computation circuit 930 and the second computation circuit 935 operate in substantially the same manner as the first computation circuit 130 described with reference to FIG. 1, and thus detailed descriptions of the first computation circuit 930 and the second computation circuit 935 have been omitted.

FIG. 10 is a flowchart of an example of a method of operating a computation circuit included in a semiconductor memory device.

Referring to FIG. 10, a method of operating a computation circuit included in the semiconductor memory device includes operations that are performed sequentially in the computation circuits shown in FIGS. 1, 3, 5, 6, and 9. Therefore, the descriptions provided above of the computation circuits in FIGS. 1, 3, 5, 6, and 9 are also applicable to the method of operating the computation circuit included in the semiconductor memory device illustrated in FIG. 10.

In operation 1010, the computation circuit receives internal data from a memory bank group during each first period of a plurality of first periods. A period during which internal data can be read from the same memory bank group is limited to the first period for the reasons discussed above in connection with FIG. 2.

In operation 1020, the computation circuit receives external data from outside the memory bank group through an internal memory bus during each second period of a plurality of second periods, the second period being shorter than the first period. The semiconductor memory device includes a plurality of memory channels, and the plurality of memory channels include a memory channel including the memory bank group. The external data is any one or any combination of any two or more of data stored in one of the plurality of memory channels other than the memory channel including the memory bank group, data stored in another semiconductor memory device outside the semiconductor memory device, and data processed by a host processor outside the semiconductor memory device. The host processor may include, but is not limited to, a CPU, a GPU, or a DSP.

The first period corresponds to the delay time tCCD_L required to consecutively access the same memory bank group, and the second period corresponds to the delay time tCCD_S required to consecutively access different memory bank groups. For example, the first period may be n times the second period, where n is a natural number equal to or greater than 2. However, n does not necessarily have to be a natural number equal to or greater than 2. That is, n may have any value as long as n is equal to or greater than 2.

In operation 1030, the computation circuit performs a PIM arithmetic operation on the internal data and the external data during each second period. The PIM arithmetic operation is an arithmetic operation performed by a computation circuit having a processing function in the semiconductor memory device. The external data is supplied to the computation circuit during the second period during a waiting period of tCCD_L after data is read from a memory bank group until data can be read again from the same memory bank group. The waiting period of tCCD_L is greater than the delay time tCCD_S required to consecutively access different memory bank groups. Therefore, the computation circuit performs an arithmetic operation during the second period. The computation circuit reuses the internal data n times in performing the arithmetic operation on the internal data and the external data. Since the second period is shorter than the first period, in the method of operating a semiconductor memory device according to the disclosure of this application, the arithmetic operation speed of the computation circuit increases.

The computation circuit stores results of the arithmetic operation performed on the internal data and the external data consecutively in n buffers, where n is a quotient obtained by dividing the first period by the second period. For example, the computation circuit may select one buffer to be connected to the computation circuit from the n buffers by outputting a control signal for controlling a demultiplexer to select one of the n buffers to store the result of the arithmetic operation performed on the internal data and the external data.

Figure 11:
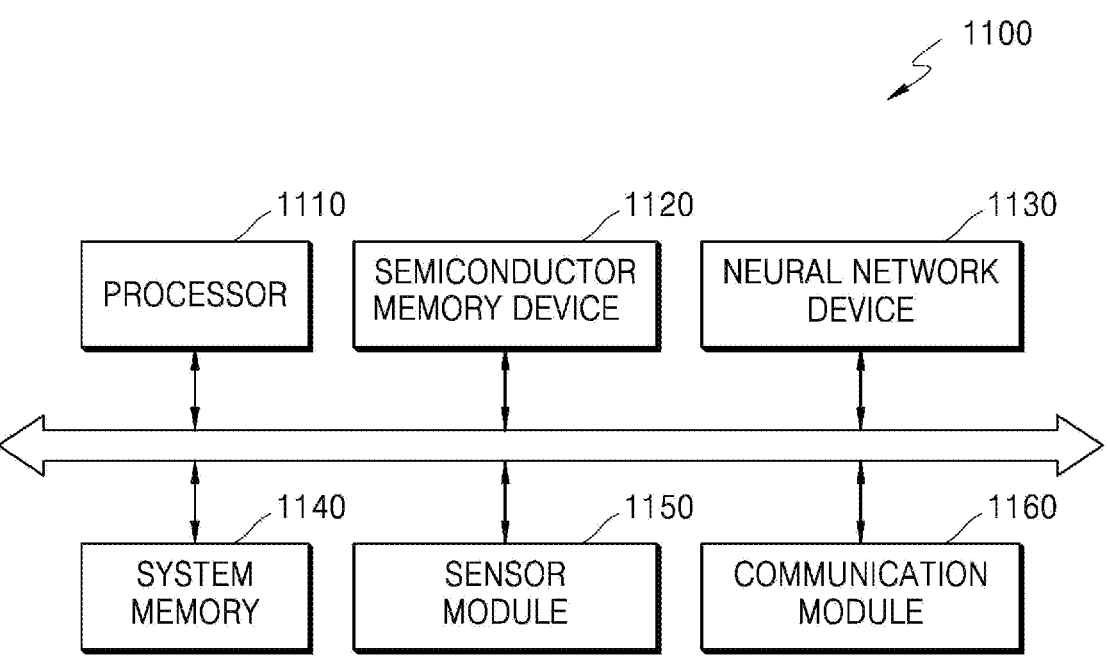
FIG. 11 is a block diagram of an example of an electronic system including a semiconductor memory device.

FIG. 11 is a block diagram of an example of an electronic system including a semiconductor memory device.

Referring to FIG. 11, an electronic system 1100 extracts valid information by analyzing input data in real time using a neural network, and determines a situation or controls components of an electronic device in which the electronic system 1100 is mounted. For example, the electronic system 1100 may be applied to a robot device such as a drone or an advanced driver-assistance system (ADAS), a smart TV, a smart phone, a medical device, a mobile device, an image display device, a measurement device, or an IoT device. In addition, the electronic system 1100 may be various other types of electronic devices. For example, the electronic system 1100 may be a server.

The electronic system 1100 includes a processor 1110, a semiconductor memory device 1120, a neural network device 1130, a system memory 1140, a sensor module 1150, and a communication module 1160. The electronic system 1100 may further include other elements, such as an input/output module, a security module, and a power control apparatus. At least some of the hardware components of the electronic system 1100 may be mounted on at least one semiconductor chip.

The processor 1110 controls an overall operation of the electronic system 1100. The processor 1110 may be a single-core processor or a multi-core processor. The processor 1110 processes data and executes programs stored in the system memory 1140. The processor 1110 controls the operation of the neural network device 1130 by executing programs stored in the system memory 1140. The processor 1110 may be implemented with a CPU, a GPU, or an application processor (AP).

The semiconductor memory device 1120 temporarily stores programs, data, and instructions. For example, programs, data, and instructions stored in the system memory 1140 are temporarily stored in the semiconductor memory device 1120 in accordance with a control or boot code of the processor 1110. The semiconductor memory device 1120 may be implemented with a memory such as DRAM. The semiconductor memory device 1120 corresponds to the semiconductor memory device described with reference to FIGS. 1 to 10. Since the semiconductor memory device 1120 has a PIM architecture, the semiconductor memory device 1120 performs not only a memory function for storing data, but also a processor function for performing arithmetic operations. Accordingly, arithmetic operations are not over-allocated to the processor 1110, and the overall performance of the electronic system 1100 increases.

The neural network device 1130 performs arithmetic operations of a neural network based on received input data and generates an information signal based on the results of the arithmetic operations. The neural network may be a convolutional neural network (CNN), a recurrent neural network (RNN), a feedforward neural network (FNN), a deep belief network (DBN), a restricted Boltzmann machine (RBM), but is not limited to thereto.

The information signal may be one of various types of recognition signals, such as a speech recognition signal, an object recognition signal, an image recognition signal, or a biometric information recognition signal. For example, the neural network device 1130 may receive, as input data, frame data included in a video stream, and generate a recognition signal from the frame data for an object included in an image represented by the frame data. However, the neural network device 1130 is not limited to this example. Rather, the neural network device 1130 may receive various types of input data according to a type or a function of an electronic device in which the electronic system 1100 is mounted, and may generate the recognition signal according to the input data.

The system memory 1140 is a storage location configured to store data, which may store an operating system (OS), various programs, and various data. In one example, the system memory 1140 stores intermediate results generated in arithmetic operations of the neural network device 1130.

The system memory 1140 may include be either one or both of a volatile memory and a nonvolatile memory. The nonvolatile memory may be ROM, PROM, EPROM, a flash memory, PRAM, MRAM, RRAM, FRAM, or any other nonvolatile memory. The volatile memory may be DRAM, SRAM, SDRAM, PRAM, MRAM, RRAM, ferroelectric RAM (FeRAM), or any other volatile memory. In one example, the system memory 1140 may include any one or any combination of any two or more of an HDD card, an SSD card, a CF card, an SD card, a microSD card, a miniSD card, an xD card, and a Memory Stick.

The sensor module 1150 collects information about the electronic device in which the electronic system 1100 is mounted. The sensor module 1150 senses or receives a signal (for example, a video signal, a voice signal, a magnetic signal, a biometric signal, or a touch signal) from outside the electronic device, and converts the sensed or received signal into data. To this end, the sensor module 1150 may include any one or any combination of any two or more of various types of sensor devices, such as a microphone, an image pickup device, an image sensor, a light detection and ranging (LIDAR) sensor, an ultrasonic sensor, an infrared sensor, a bio-sensor, and a touch sensor.

The sensor module 1150 provides converted data, as the input data, to the neural network device 1130. In one example, the sensor module 1150 includes an image sensor, generates a video stream by photographing an external environment of the electronic device, and provides successive data frames of the video stream, as the input data, to the neural network device 1130 in sequence, However, this is merely one example, and the sensor module 1150 may provide various other types of data to the neural network device 1130.

The communication module 1160 includes various wired or wireless interfaces that are capable of communicating with an external device. For example, the communication module 1160 may include an interface that is connectable to a local area network (LAN), a wireless local area network (WLAN) such as Wi-Fi, a wireless personal area network (WPAN) such as Bluetooth or ZigBee, a wireless universal serial bus (USB), near-field communication (NFC), radio-frequency identification (RFID), power line communication (PLC), or a mobile cellular network such as third generation (3G), fourth generation (4G), or long-term evolution (LTE).

Figure 12:
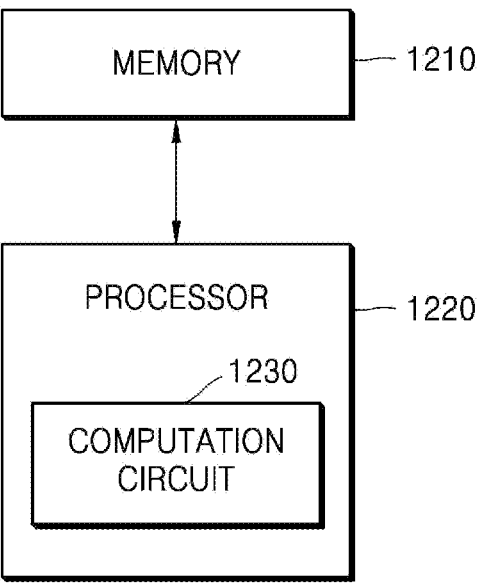
FIG. 12 is a block diagram of an example of the computation circuits of FIGS. 1, 3, 5, 6, and 9.

FIG. 12 is a block diagram of an example of the computation circuits of FIGS. 1, 3, 5, 6, and 9.

Referring to FIG. 12, a memory 1210 stores instructions that, when executed by a processor 1220, cause the processor 1220 to perform the functions of the computation circuits of FIGS. 1, 3, 5, 6, and 9. Although FIG. 12 shows a single computation circuit 1230 for convenience of illustration, the processor 1220 may perform the functions of the first computation circuit 130 and the second computation circuit 135 in FIG. 1, the first computation circuit 130 and the second through eighth computation circuits that are not identified by reference numerals in FIG. 5, and the first computation circuit 930, the second computation circuit 935, and the third and fourth computation circuits that are not identified by reference numerals in FIG. 9.

In another example, the processor 1220 may perform the functions of only the first computation circuit 130 in FIG. 1, and a second processor like the processor 1220 may perform the functions of only the second computation circuit 135 in FIG. 1. Also, the processor 1220 may perform the functions of only the first computation circuit 130 in FIG. 5, and second through eighth processors like the processor 1220 may respectively perform the functions of the second through eighth computation circuits that are not identified by reference numerals in FIG. 5. Also, the processor 1220 may perform the functions of only the first computation circuit 930 in FIG. 9, and second through fourth processors like the processor 1220 may respectively perform the functions of the second computation circuit 935 and the third and fourth computation circuits that are not identified by reference numerals in FIG. 9.

In another example, the processor 1220 and anywhere from one to six additional processors like the processor 1220 may perform the functions of the first computation circuit 130 and the second through eighth computation circuits that are not identified by reference numerals in FIG. 5, with at least one of the processor 1220 and the one to six additional processors performing the functions of at least two of the first computation circuit 130 and the second through eighth computation circuits in FIG. 5. Also, the processor 1220 and one or two additional processors like the processor 1220 may perform the functions of the first computation circuit 930, the second computation circuit 935, and the third and fourth computation circuits that are not identified by reference numerals in FIG. 9, with at least one of the processor 1220 and the one or two additional processors performing the functions of at least two of the first computation circuit 930, the second computation circuit 935, and the third and fourth computation circuits in FIG. 9.

The computation circuits of FIGS. 1, 3, 5, 6, and 9 that perform the operations described in this application are implemented by hardware components configured to perform the operations described in this application that are performed by the hardware components. Examples of hardware components that may be used to perform the operations described in this application where appropriate include controllers, sensors, generators, drivers, memories, buffers, comparators, arithmetic logic units, adders, subtractors, multipliers, dividers, integrators, multiplexers, demultiplexers, transistors, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method of FIG. 10 described with reference to FIGS. 1 to 9 that performs the operations described in this application are performed by hardware components, or by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor memory device comprising:
a first memory bank and a second memory bank separate from the first memory bank;
a first computation circuit comprises buffers and is configured to perform an arithmetic operation on:
a first data received from the first memory bank during a first period; and

a second data received from the second memory bank during a second period, wherein a length of time of the first period is equal to twice the second period or more than twice the second period, wherein the arithmetic operation is repeatedly performed a maximum number of times during the first period, and wherein a number of the buffers corresponds to the maximum number of times, and each of the buffers is configured to store a result of the arithmetic operation performed on the first data and the second data.

2. The semiconductor memory device of claim 1, wherein the first period corresponds to a delay time required to consecutively access a same memory bank, and the second period corresponds to a delay time required to consecutively receive the second data through a memory bus.

3. The semiconductor memory device of claim 2, wherein the memory bus is configured to form a connection path in the semiconductor memory device.

4. The semiconductor memory device of claim 1, wherein the first computation circuit is configured to receive the second data repeatedly the maximum number of times during the first period.

5. The semiconductor memory device of claim 1, wherein the maximum number of times corresponds to a quotient obtained by dividing the first period by the second period.

6. The semiconductor memory device of claim 1, wherein the first computation circuit is further configured to reuse the first data the maximum number of times in performing the arithmetic operation on the first data and the second data.

7. The semiconductor memory device of claim 1, wherein the first computation circuit is further configured to consecutively store the result of the arithmetic operation performed on the first data and the second data in the buffers.

8. The semiconductor memory device of claim 1 wherein the first computation circuit further comprises:

a demultiplexer connected to the buffers, and a selector configured to output a control signal to control the demultiplexer to select one of the buffers to store the result of the arithmetic operation performed on the first data and the second data.

9. The semiconductor memory device of claim 8, wherein the selector comprises a counter configured to count first periods, including the first period, or second periods, including the second period, and output a count value of the counter as the control signal.

10. The semiconductor memory device of claim 1, further comprising a second computation circuit configured to operate in parallel with the first computation circuit,

wherein the first computation circuit and the second computation circuit are allocated to different memory banks or different memory bank groups, each memory bank group including two or more memory banks.

11. A method of operating a computation circuit comprising buffers in a semiconductor memory device, the semiconductor memory device comprising a first memory bank, a second memory bank separate from the first memory bank, and the computation circuit, the method comprising:

performing an arithmetic operation on:

a first data received from the first memory bank during a first period; and a second data received from the second memory bank during a second period, wherein a length of time of the first period is equal to twice the second period or more than twice the second period, wherein the arithmetic operation is repeatedly performed a maximum number of times during the first period and wherein a number of the buffers corresponds to the maximum number of times, and each of the buffers is configured to store a result of the first data and the second data.

12. The method of claim 11, wherein the first period corresponds to a delay time required to consecutively access a same memory bank, and the second period corresponds to a delay time required to consecutively receive the second data through a memory bus.

13. The method of claim 12, wherein the memory bus is configured to form a connection path in the semiconductor memory device.

14. The method of claim 12, wherein the maximum number of times corresponds to a quotient obtained by dividing the first period by the second period.

15. The method of claim 12, wherein the performing of the arithmetic operation on the first data and the second data comprises reusing the first data the maximum number of times in performing the arithmetic operation on the first data and the second data.

16. The method of claim 11, wherein the computation circuit further comprises a demultiplexer connected to the buffers, and the consecutively storing of the result of the arithmetic operation performed on the first data and the second data comprises outputting a control signal to control the demultiplexer to select one of the buffers to store the result of the arithmetic operation performed on the first data and the second data.

* * * * *